United States Patent
Cheng et al.

(10) Patent No.: US 8,091,762 B1
(45) Date of Patent: Jan. 10, 2012

(54) WEDGE BONDING METHOD INCORPORATING REMOTE PATTERN RECOGNITION SYSTEM

(75) Inventors: Chi Wah Cheng, Tsing Yi (HK); Man Kit Mui, Kowloon (HK); Hon Kam Ng, Tsing Yi (HK); Hei Lam Chang, Yuen Long (HK)

(73) Assignee: ASM Assembly Automation Ltd, Hong Kong (HK)

( * ) Notice: Subject to any disclaimer, the term of this patent is extended or adjusted under 35 U.S.C. 154(b) by 0 days.

(21) Appl. No.: 12/962,755

(22) Filed: Dec. 8, 2010

(51) Int. Cl.
 *B23K 31/02* (2006.01)
(52) U.S. Cl. .................. 228/102; 228/105; 228/180.5
(58) Field of Classification Search .................. None
 See application file for complete search history.

(56) References Cited

U.S. PATENT DOCUMENTS

| | | | | |
|---|---|---|---|---|
| 3,125,906 | A * | 3/1964 | Johnson ................. | 228/4.5 |
| 3,773,240 | A * | 11/1973 | Heim ...................... | 228/4.5 |
| 3,813,022 | A * | 5/1974 | Radobenko ............ | 228/4.5 |
| 3,894,671 | A * | 7/1975 | Kulicke et al. ......... | 228/4.5 |
| 3,941,294 | A * | 3/1976 | Johannsmeier ........ | 228/4.5 |
| 3,941,985 | A * | 3/1976 | Kawase et al. ........ | 318/569 |
| 4,340,166 | A * | 7/1982 | Bilane et al. ........ | 228/180.5 |
| 4,437,603 | A * | 3/1984 | Kobayashi et al. .... | 228/4.5 |
| 4,671,446 | A * | 6/1987 | Sherman ................ | 228/4.5 |
| 4,759,073 | A * | 7/1988 | Shah et al. ............. | 382/151 |
| 4,781,319 | A * | 11/1988 | Deubzer et al. ........ | 228/4.5 |
| 5,044,072 | A * | 9/1991 | Blais et al. ............. | 29/834 |
| 5,199,628 | A * | 4/1993 | Homma .................. | 228/4.5 |
| 5,400,503 | A * | 3/1995 | Komoriya et al. ...... | 29/850 |
| 5,566,876 | A * | 10/1996 | Nishimaki et al. ...... | 228/102 |
| 5,579,984 | A * | 12/1996 | Sasano ................... | 228/102 |
| 5,702,049 | A * | 12/1997 | Biggs et al. ............ | 228/105 |
| 5,720,424 | A * | 2/1998 | Takeuchi ................ | 228/4.5 |
| 5,862,974 | A * | 1/1999 | Sasano ................... | 228/4.5 |
| 5,934,543 | A * | 8/1999 | Koduri ................... | 228/102 |
| 6,382,494 | B1 * | 5/2002 | Miller ..................... | 228/1.1 |
| 6,467,673 | B2 * | 10/2002 | Enokido et al. ........ | 228/105 |
| 6,667,625 | B1 * | 12/2003 | Miller ..................... | 324/525 |
| 6,945,446 | B2 * | 9/2005 | Hayata ................... | 228/103 |
| 7,004,373 | B1 * | 2/2006 | Miller ..................... | 228/103 |
| 7,624,904 | B1 * | 12/2009 | Smith ..................... | 228/4.5 |
| 7,886,956 | B2 * | 2/2011 | Seyama et al. ......... | 228/105 |
| 2002/0008131 | A1 * | 1/2002 | Hess et al. ............. | 228/105 |
| 2002/0039437 | A1 * | 4/2002 | Sugawara .............. | 382/151 |
| 2002/0096553 | A1 * | 7/2002 | Copperthite ......... | 228/180.5 |
| 2002/0162875 | A1 * | 11/2002 | Miller ..................... | 228/4.5 |
| 2003/0010806 | A1 * | 1/2003 | Itoh et al. ............... | 228/19 |
| 2004/0129754 | A1 * | 7/2004 | Suresh et al. .......... | 228/4.5 |
| 2004/0155089 | A1 * | 8/2004 | Seki et al. ............... | 228/8 |

(Continued)

FOREIGN PATENT DOCUMENTS

JP 58-178528 A * 10/1983

(Continued)

*Primary Examiner* — Kiley Stoner
(74) *Attorney, Agent, or Firm* — Ostrolenk Faber LLP

(57) ABSTRACT

A wire is bonded to a target surface using a rotary bond head by positioning a wedge bonding tool of the bond head over the target surface. A camera system is tilted at an oblique angle relative to an arrangement of the bond head to conduct pattern recognition of bonding points on the target surface for determining actual positions of the bonding points and an orientation between the actual positions of first and second bonding points. The bond head is moved to the actual position of the first bonding point and rotated to the determined orientation. Thereafter, the wire is bonded to the target surface at the first bonding point with the bond head.

15 Claims, 3 Drawing Sheets

U.S. PATENT DOCUMENTS

| | | | | |
|---|---|---|---|---|
| 2004/0245314 | A1* | 12/2004 | Vischer | 228/4.5 |
| 2005/0167470 | A1* | 8/2005 | Enokido | 228/103 |
| 2005/0284914 | A1* | 12/2005 | Beatson et al. | 228/4.5 |
| 2006/0255097 | A1* | 11/2006 | Walther | 228/101 |
| 2010/0127045 | A1* | 5/2010 | Cheng et al. | 228/104 |

FOREIGN PATENT DOCUMENTS

| | | | |
|---|---|---|---|
| JP | 60-120532 A | * | 6/1985 |
| JP | 01-017434 A | * | 1/1989 |

* cited by examiner

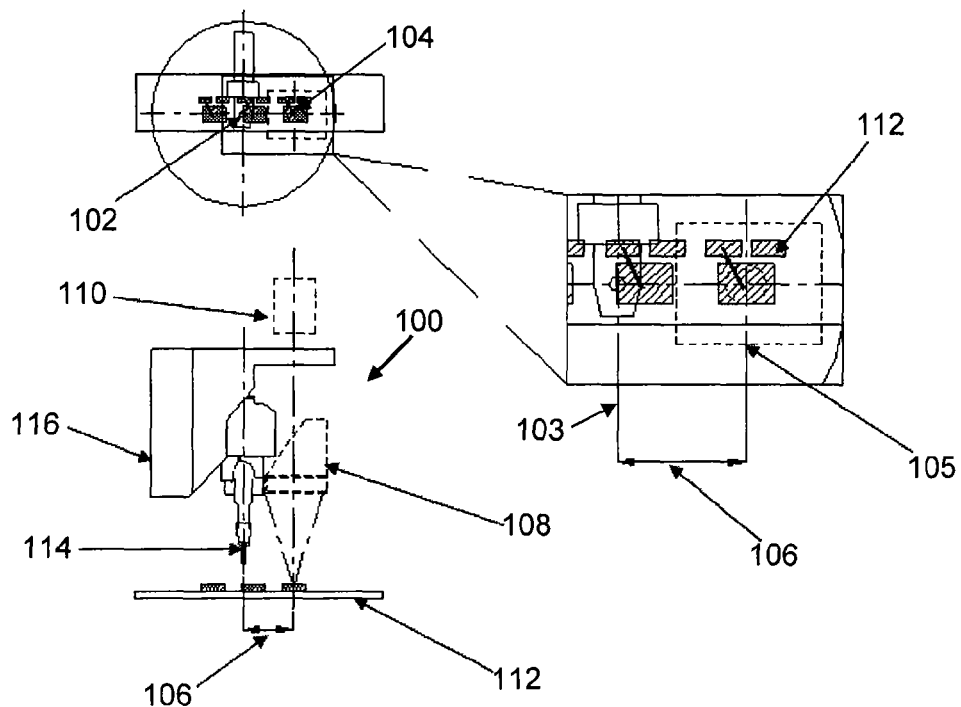
FIG. 1 (Prior Art)
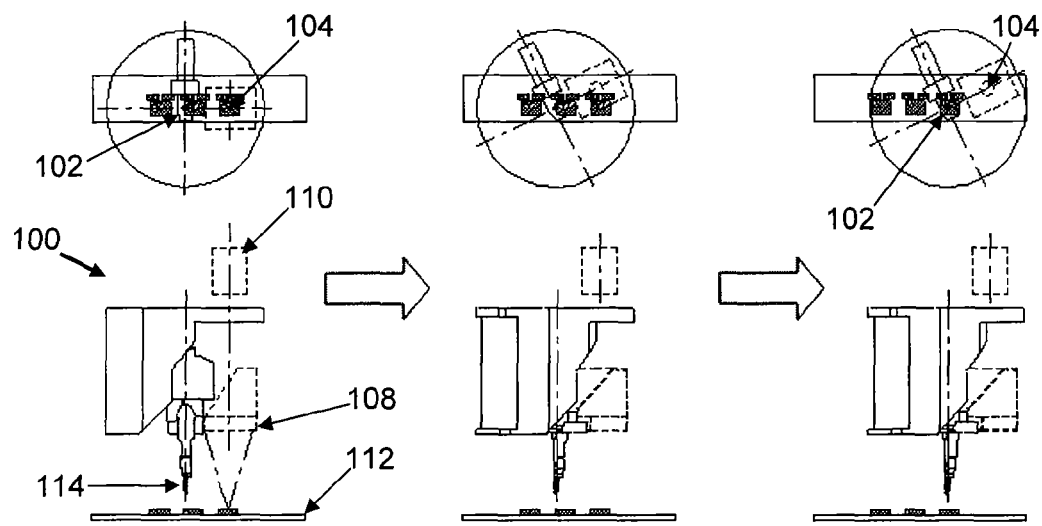
FIG. 2A     FIG. 2B     FIG. 2C
(Prior Art)

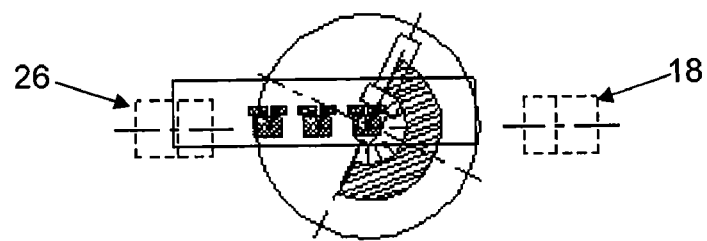
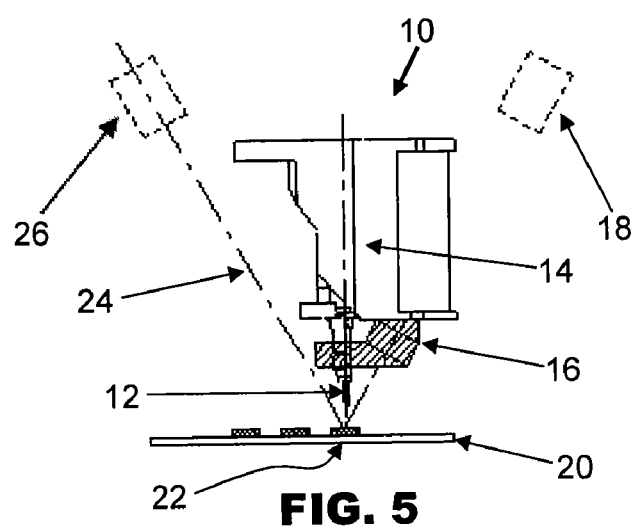
FIG. 5
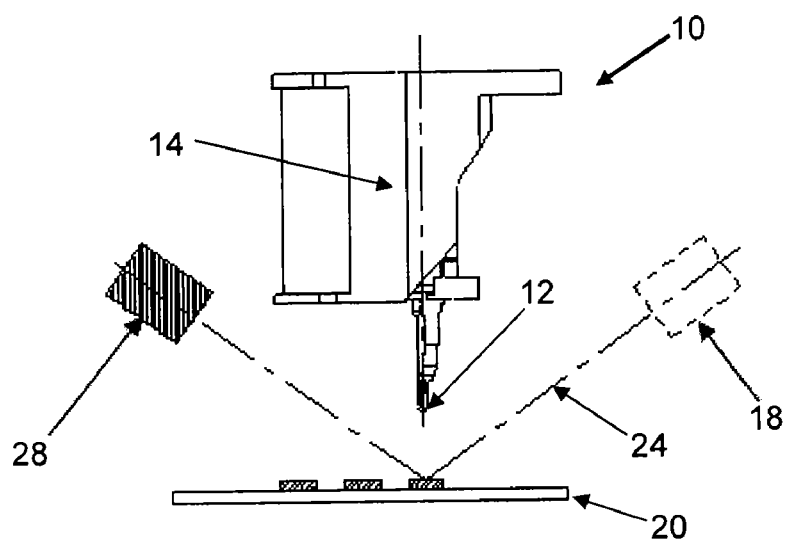
FIG. 6

WEDGE BONDING METHOD INCORPORATING REMOTE PATTERN RECOGNITION SYSTEM

FIELD OF THE INVENTION

The invention relates to wire bonding, and in particular, to wedge bonding to make wire connections using a wedge-shaped bonding tool.

BACKGROUND AND PRIOR ART

FIG. 1 illustrates side and plan views of a rotary bond head 100 during pattern recognition ("PR") alignment. The rotary bond head 100 has a wedge bonding tool 114 at its bottom end and in attached to a main bracket 116 for mounting the bond head 100.

In such existing bond head designs, a bonding wedge center 102 (also a rotary center of a theta axis of the bond head 100) is not aligned with a PR optical center 104 of the bond head 100. A PR optics assembly 108 which provides coaxial light and is operative to inspect a substrate such as a lead frame 112 to be bonded is located and mounted next to the bonding wedge center 102. It is coupled with the theta axis of the bond head 100. In this configuration, there is a distance separating the bonding wedge center 102 and the PR optical center 104. This distance, measured from a rotary center line 103 to an optical center line 105, is called the bond tip offset or BTO 106. A PR alignment camera assembly 110 is mounted on an XY positioning table vertically above the PR optics assembly 108.

An image of a target surface can only be captured when the bond head 100 is fixed at a particular theta orientation where the PR optics assembly 108 and the PR alignment camera assembly 110 are located over the target surface for conducting PR alignment on the target surface. Therefore, during a bonding sequence, the bond head 100 needs to rotate to a predetermined angle for PR alignment first, and thereafter, it needs to move and rotate such that the bonding wedge center 102 and bond head rotary angle is aligned with a target bonding direction of the wire.

FIGS. 2A to 2C illustrate a conventional bonding sequence including PR alignment. In FIG. 2A, the bond head 100 is positioned at a particular theta orientation for PR alignment of the target object. After the locations of bonding points and an orientation of a wire connection is determined, the bond head 100 will be moved sideways and rotated such that the bond wedge center 102 is aligned with the target bonding direction as shown in FIG. 2B and FIG. 2C. Both the XY motion and theta rotation are necessary for BTO movement and wedge rotation. The latter rotates the bonding tool 114 to the required bonding orientation.

Since movement of the bond head 100 in the XY and theta directions are necessary for PR alignment prior to bonding each wire connection, the overall bonding time will be slower due to this additional motion that has to be conducted apart from the actual bonding operation.

SUMMARY OF THE INVENTION

Thus, it is an object of the invention to seek to provide a wedge bonding method which avoids the aforesaid additional motion undertaken for PR alignment prior to bonding each wire connection.

Accordingly, the invention provides a method for bonding a wire to a target surface using a rotary bond head, comprising the steps of: positioning a wedge bonding tool of the bond head over the target surface; conducting pattern recognition of bonding points on the target surface using a camera system that is tilted at an oblique angle relative to an arrangement of the bond head; determining actual positions of the bonding points obtained from the step of pattern recognition and an orientation between the actual positions of first and second bonding points; moving the bond head to the actual position of the first bonding point and rotating the bond head to the determined orientation; and thereafter bonding the wire to the target surface at the first bonding point with the bond head.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus and method in accordance with the invention will now be described with reference to the accompanying drawings, in which:

FIG. 1 illustrates side and plan views of a rotary bond head during PR alignment;

FIGS. 2A to 2C illustrate a conventional bonding sequence including PR alignment;

FIG. 5 shows side and plan views of a rotary bond head including an additional remote camera system according to a second preferred embodiment of the invention; and FIG. 6 is a side view of a rotary bond head comprising a remote tilted PR optics system according to a third preferred embodiment of the invention.

DETAILED DESCRIPTION OF THE PREFERRED EMBODIMENTS OF THE INVENTION

Figure 3:
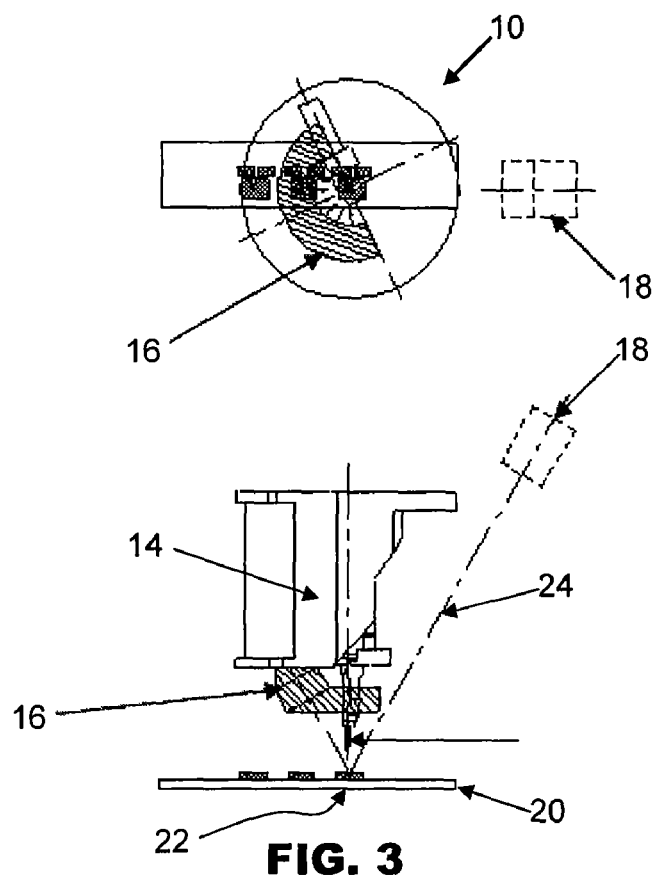
FIG. 3 illustrates side and plan views of a rotary bond head with a remote camera system according to a first preferred embodiment of the invention during PR alignment.

FIG. 3 illustrates side and plan views of a rotary bond head 10 with a remote camera system 18 according to a first preferred embodiment of the invention during PR alignment. The bond head has a wedge bonding tool 12 at its bottom end and is attached to a main bracket 14 for mounting the bond head 10. In this first embodiment, the camera system 18 is tilted and has an optical center which is substantially coincides with a center of rotation or bonding wedge center 22 of the rotary bond head 10. Therefore, there is no offset between the optical center and the bonding wedge center 22 on a target surface.

The remote camera system 18 is mounted on an XY table module (not shown) and tilted at an oblique angle relative to a vertical arrangement of the bond head 10 (about 20° to 45° from the vertical). It is arranged to focus directly on the target surface (die or lead surface of a leadframe 20) to obtain images of bonding points located on the target surface. A PR optics system 16 including a lighting source is mounted on the bond head 10 on an opposite side of a rotary axis of the bond head 10 as compared to the camera system 18. The PR optics system 16 provides coaxial lighting for image capture by the camera system 18. Since the camera system 18 is tilted, its optical path 24 will be focused at the bonding wedge center 22 (center of rotation of the bond head 10) such that there is no offset between the bonding wedge center 22 and the optical center of the camera system 18 at the end of its optical path 24. The lighting source is elongated such that it surrounds the target surface (covering an angle of up to 180°) to provide coaxial light to the target surface. The lighting source is mounted on an opposite side of the rotary axis of the bond head 10 as compared to the position of the camera system 18. Since the PR optics system 16 is mounted on the bond head 10 and rotates with the bond head 10, images can be captured from the remote camera system 18 when the bond head 10 rotates at angles of up to 180°. Essentially, images of the surface are captured only when the bond head 10 rotates to angles where the lighting source is positioned opposite to the camera system 18 about the rotary axis.

Figure 4:
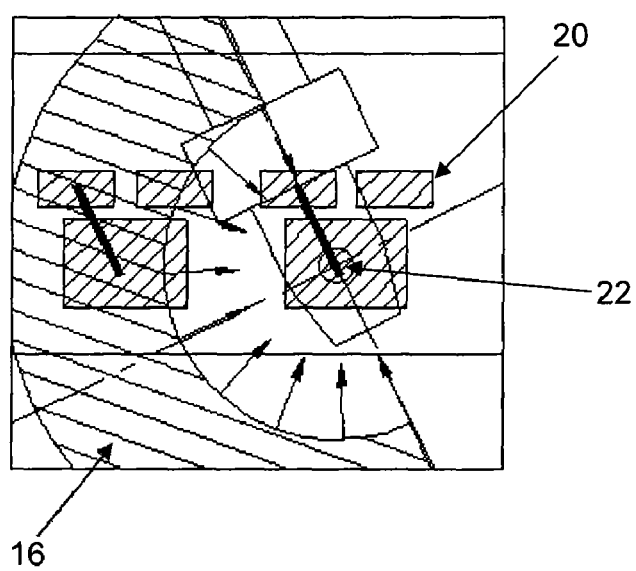
FIG. 4 is an enlarged plan view of the bond head position during PR alignment.

FIG. 4 is an enlarged plan view of the bond head position during PR alignment. In FIG. 4, the bond head is already rotated to a required pre-taught theta orientation for making the first bond according to the requirement for wedge bonding a length of wire of a desired wire orientation. The leadframe 20 is then indexed into the bonding site for wire bonding, and the rotary bonding wedge center 22 of the bond head 10 is located over a pre-taught first bond position on the leadframe 20.

With the abovementioned design of the bond head 10, the bonding sequence will be as follows:
(1) Before the leadframe 20 is indexed into the bonding site, the bond head 10 is rotated to the pre-taught theta orientation for making the first bond according to the required wire orientation for wedge bonding. The center of rotation of the bond head (bonding wedge center 22) is located above the pre-learned first bond position.
(2) The lighting source of the PR optics system 16 will be switched on and then PR alignment of the bonding surface of the leadframe 20 will be conducted by the tilted camera system 18 to locate the actual positions of first and second bonding points for bonding, as well as an orientation between the first and second bonding points.
(3) Based on a computation result obtained from PR alignment and the pre-learnt reference position, the bond head 10 position may be compensated accordingly by moving it slightly in X, Y or theta directions to the actual first bonding point.
(4) The bond head Z-module carrying the wedge bonding tool will descend to make the first bond, looping the bonding wire and then bonding the second bond at the second bonding point.
(5) The bond head Z-module will move back to the pre-set height after the last bond at the unit to be bonded is completed.
(6) The leadframe 20 will be indexed to the next unit to be bonded and the bond head 10 will rotate to an orientation that is aligned to another pre-taught target bonding wire direction. The above bonding cycle is then repeated.

FIG. 5 shows side and plan views of a rotary bond head 10 including an additional remote camera system 26 according to a second preferred embodiment of the invention. The second embodiment of the invention is an extension of first embodiment in that two remote camera systems 18, 26 are mounted on opposite sides of the bond head 10.

The two tilted camera systems 18, 26 are mounted on a single XY table module or separate XY table modules, which may be similar to the XY table module used in the first embodiment. Where there is a single camera system 18, the camera system 18 it can only capture images of the target surface when the bond head 10 is rotated to a first set of rotary angles, such as up to 180° in the above example. After an extra tilted camera system 26 is mounted, images used for PR alignment can be captured from another side of the bond head 10 when the bond head 10 is rotated to a second set of rotary angles (for example, another 180°) that the first preferred embodiment is not capable of capturing when the PR optics system 16 rotates with the bond head 10. Consequently, the object image may be captured by the respective tilted remote camera systems 18, 26 at any bond head angle.

With the abovementioned design of the bond head 10, the bonding sequence will be the same as the one described for the first embodiment. However, the advantage of the second preferred embodiment is that it facilitates wire bonding when there are two wires to be bonded that have different orientations which are separated by more than 180° from each other.

In the first and second preferred embodiments of the invention, it is also possible that the distance between the bonding wedge center 22 and the optical center of the camera system 18 may not be zero when the remote camera system is tilted in certain angle that is not focusing on the target surface directly. That is, there may be a BTO. This may occur if some components around the bond head 10 block the optical path 24 of the camera system 18 such that zero BTO cannot be achieved. Under such a configuration, a small horizontal XY movement to cater for BTO will be needed.

FIG. 6 is a side view of a rotary bond head comprising a remote tilted PR optics system 28 according to a third preferred embodiment of the invention. The third embodiment of the invention is different from the first and second embodiments in that there is one remote camera system 18 and one remote PR optics system 28 for capturing images at any bond head angle.

The remote PR optics system 28 including a lighting source is mounted on an XY table module (not shown) on an opposite side of the bond head 10 as compared to the position of the camera system 18. It generally mirrors the position of the camera system 18 on the opposite side of the bond head 10 about the rotary axis of the bond head 10. In this design, the bond head 10 will be raised to a sufficient height during PR alignment so that the optical path will not be blocked by the bond head 10 or any mechanism next to the wedge bonding tool 12.

Since the PR optics system 28 is decoupled from the theta motion axis of the bond head 10, the single remote camera system 18 can be used for image capturing at any bond head angle.

It should be appreciated that the arrangements of the bond head 10, PR optics system 16 and camera system 18 according to the preferred embodiments of the invention help to optimize the transition of the working sequence between PR alignment and the subsequent bonding process. The resultant bonding sequence shortens the overall bonding cycle as compared to conventional bonding sequences since additional movement to cater for any BTO differences is unnecessary after the step of PR alignment. The stability of the bond head 10 is also improved in the third preferred embodiment as the PR optics system 28 is separated from the bond head 10, and thus the mass and moment of inertia of the bond head 10 is reduced.

The invention described herein is susceptible to variations, modifications and/or additions other than those specifically described and it is to be understood that the invention includes all such variations, modifications and/or additions which fall within the spirit and scope of the above description.

The invention claimed is:

1. A method for bonding a wire to a target surface using a rotary bond head, comprising the steps of:
   positioning a wedge bonding tool of the bond head over the target surface;
   conducting pattern recognition of bonding points on the target surface using a camera system that is tilted at an oblique angle relative to an arrangement of the bond head;

determining actual positions of the bonding points obtained from the step of pattern recognition and an orientation between the actual positions of first and second bonding points;

moving the bond head to the actual position of the first bonding point and rotating the bond head to the determined orientation; and thereafter bonding the wire to the target surface at the first bonding point with the bond head.

2. The method as claimed in claim 1, wherein the bond head is arranged vertically and the camera system is tilted at an angle of between 20° and 45° relative to the vertically-arranged bond head.

3. The method as claimed in claim 1, wherein the camera system is focused to obtain images of the bonding points located on the target surface.

4. The method as claimed in claim 3, wherein the rotary bond head has a center of rotation and the camera system has an optical center which is arranged to substantially coincide with the center of rotation so that there is substantially no offset between the center of rotation and the optical center on the target surface.

5. The method as claimed in claim 1, wherein the rotary bond head has a rotary axis and the method further comprises the step of providing coaxial light to the target surface using an optics system including a lighting source which is mounted on an opposite side of the rotary axis as compared to the camera system.

6. The method as claimed in claim 5, wherein the optics system is mounted on the bond head and rotates together with the bond head, and the lighting source is arranged in the form of an arc which covers an angle of up to 180°.

7. The method as claimed in claim 6, wherein the step of pattern recognition further comprises the step of capturing images of the surface only when the bond head rotates to angles where the lighting source is positioned opposite to the camera system about the rotary axis.

8. The method as claimed in claim 1, further comprising the step of rotating the bond head to a pre-taught rotary orientation before positioning the bond head over the target surface.

9. The method as claimed in claim 1, further comprising the step of conducting pattern recognition of the bonding points with an additional camera system which is mounted on an opposite side of the bond head as compared to the said camera system.

10. The method as claimed in claim 9, wherein the rotary bond head is rotatable to a first set of rotary angles and a second set of rotary angles, and wherein one camera system captures images for the first set of the rotary angles, and the other camera system captures images for the second set of the rotary angles.

11. The method as claimed in claim 10, wherein the first set of rotary angles constitutes half of the rotary angles of the bond head and the second set of rotary angles constitutes another half of the rotary angles of the bond head.

12. The method as claimed in claim 1, further comprising the step of adjusting the surface horizontally to the actual position of the first bonding point while the bond head is moving towards the target surface to bond the wire to the target surface.

13. The method as claimed in claim 1, wherein an optics system including a lighting source is located on an opposite side of the bond head as compared to a position of the camera system about a rotary axis of the rotary bond head, and the optics system mirrors the position of the camera system about the rotary axis of the rotary bond head.

14. The method as claimed in claim 13, wherein prior to the step of pattern recognition, the method further comprises the step of raising the bond head to a sufficient height to avoid blocking the camera system's optical path.

15. The method as claimed in claim 13, wherein the optics system is not mounted to the bond head so as to be decoupled from rotation of the bond head.

* * * * *